US009907220B2

(12) United States Patent
Bilato et al.

(10) Patent No.: US 9,907,220 B2
(45) Date of Patent: Feb. 27, 2018

(54) STORAGE UNIT

(71) Applicant: ESSEGI SYSTEM SERVICE S.R.L., Creazzo (VI) (IT)

(72) Inventors: Alessandro Bilato, Creazzo (IT); Giuseppe Garbin, Creazzo (IT); Matteo Padoan, Sovizzo (IT)

(73) Assignee: Essegi System Service S.R.L., Creazzo (VI) (IT)

( * ) Notice: Subject to any disclaimer, the term of this patent is extended or adjusted under 35 U.S.C. 154(b) by 0 days.

(21) Appl. No.: 15/533,582

(22) PCT Filed: Dec. 21, 2015

(86) PCT No.: PCT/IB2015/059842
§ 371 (c)(1),
(2) Date: Jun. 6, 2017

(87) PCT Pub. No.: WO2016/103154
PCT Pub. Date: Jun. 30, 2016

(65) Prior Publication Data
US 2018/0014438 A1 Jan. 11, 2018

(30) Foreign Application Priority Data

Dec. 22, 2014 (IT) .............................. VI2014A0328

(51) Int. Cl.
*G06F 7/00* (2006.01)
*H05K 13/02* (2006.01)
(Continued)

(52) U.S. Cl.
CPC ....... *H05K 13/021* (2013.01); *H05K 13/0084* (2013.01); *H05K 13/08* (2013.01)

(58) Field of Classification Search
None
See application file for complete search history.

(56) References Cited

U.S. PATENT DOCUMENTS 5,621,713 A * 4/1997 Sato ..................... G11B 17/056
720/607
2004/0031768 A1 2/2004 Nobuyuki
(Continued)

FOREIGN PATENT DOCUMENTS

DE 20 2004 006920 U1 9/2005
EP 0 302 542 A1 2/1989
(Continued)

OTHER PUBLICATIONS

International Search Report and Written Opinion dated May 19, 2016, issued in PCT Application No. PCT/IB2015/059842, filed on Dec. 21, 2015.

*Primary Examiner* — Yolanda R Cumbess
(74) *Attorney, Agent, or Firm* — Workman Nydegger

(57) ABSTRACT

A storage unit includes an accumulation structure defined by a plurality of vertical walls having a plurality of guides arranged horizontally and configured to support a plurality of trays. In each tray there is at least one shaped housing that accommodates at least one object and on the sides of the tray there are shaped edges configured to be slidingly coupled with the guides when the tray is inserted between two consecutive vertical walls. Each tray is configured so as to receive on its upper surface one or more spacer elements that can be superimposed to one another and to the upper surface and connected to one another and to the upper surface through removable connections in order to vary the depth of the shaped housing. Movers are provided that are suited to move the trays with the objects arranged thereon and to insert/extract the trays in/from the guides.

16 Claims, 13 Drawing Sheets

(51) Int. Cl.
*H05K 13/00* (2006.01)
*H05K 13/08* (2006.01)

(56) References Cited

U.S. PATENT DOCUMENTS

| | | | | |
|---|---|---|---|---|
| 2014/0104826 | A1* | 4/2014 | Bergdoll | A47B 57/16 |
| | | | | 362/223 |
| 2017/0161982 | A1* | 6/2017 | Iwako | G07F 11/04 |
| 2017/0211815 | A1* | 7/2017 | Padula | F24C 7/002 |
| 2017/0300031 | A1* | 10/2017 | Bernhard | G05B 19/402 |

FOREIGN PATENT DOCUMENTS

| | | |
|---|---|---|
| EP | 1 928 221 A3 | 6/2008 |
| EP | 2 792 619 A1 | 10/2014 |

* cited by examiner

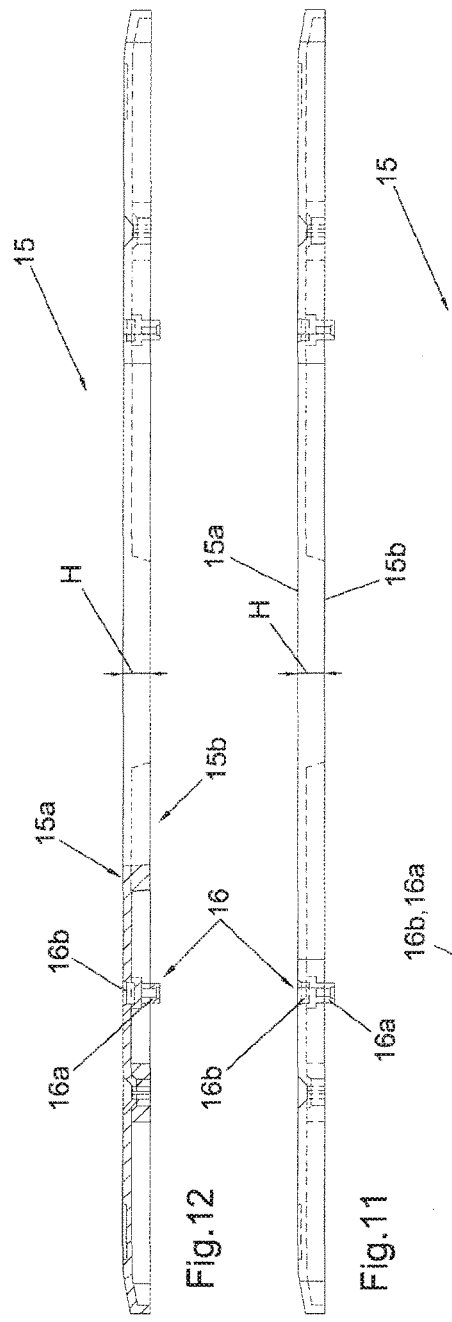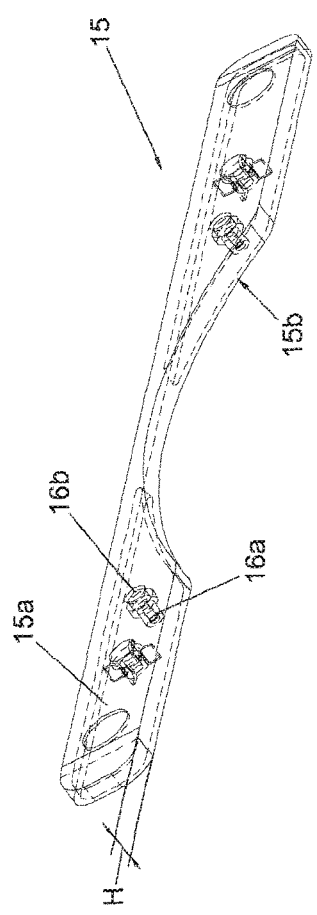

STORAGE UNIT

BACKGROUND OF THE INVENTION

1. Field of the Invention

The invention concerns an improved storage unit intended to be used especially, but not exclusively, for storing elements having a mainly plane bidimensional shape and limited thickness, such as, for example, electronic components, tapes wound on reels, microprocessor trays, possibly housed in their respective casings.

In particular, the storage unit that is the subject of the invention is intended to be used especially in the field of electronics, in particular by those companies that operate in the sector of electronic board assembly, in which it is used for storing and collecting reels of flexible tapes in which electronic components of the SMD (Surface Montage Devices) type are inserted.

The storage unit that is the subject of the invention, however, can be used to store objects of any type and any configuration, provided that they can be handled by an operator.

2. Present State of the Art

As is known, the assembly of electronic boards is carried out with automatic machines in which special motorised arms equipped with gripping tongs collect the electronic components present on a tape wound on a reel and insert them in a rigid support (printed circuit).

Each reel contains components of the same type and therefore a number of reels corresponding to the number of items to be assembled on the board is loaded on the assembly machine.

Reels are usually kept inside storage units where they are inserted in an accumulation structure that is provided inside the storage unit.

According to the known technique, the accumulation structure is constituted by a plurality of compartments that are rectangular in shape and positioned side by side and/or superimposed to one another, each one of which has a size that is suitable for housing a corresponding reel or a similar object.

When needed, the reels are collected from the respective compartments and loaded on the board assembly machine.

At the end of the board assembly process, the reels that have not been used completely are unloaded from the machine and inserted again in the respective compartments in the accumulation structure located inside the storage unit.

In the case of storage units of the manual type, the reels are collected and successively replaced manually by the operator, who identifies them visually according to their code or description.

In the case of automatic or semi-automatic storage units, instead, the reels are collected and successively replaced by automatic handling systems, interfaced with reading means suited to read the identification codes of the reels.

Independently of whether the known storage units are of the manual, semi-automatic or automatic type, they pose the drawback that the compartments making up the accumulation structures have fixed dimensions that are pre-established during the construction of the storage unit.

Considered that the reels come in different sizes, it is therefore necessary, already during the construction of the storage unit, to define in advance the number and the size of the compartments that will make up the accumulation structure.

This means that for every type of reel to be managed in the storage unit it will be necessary to define in advance the availability of a predetermined number of compartments, each one of which is suited to accommodate a corresponding reel having predefined maximum dimensions.

It can be understood that this involves the need to provide a storage unit with a static accumulation structure with low saturation of the available accumulation volume, due to the large number of compartments that remain unused when the mix of reel sizes to be managed is very different from the mix of sizes of the compartments that make up the accumulation structure.

This inevitably leads to a useless and expensive waste of the available storage space.

Therefore it happens that the operator, in order to be able to place all the types of reels included in the mix to be managed, may need to install a number of storage units in excess with respect to the necessary number, thus incurring useless costs.

Furthermore, for the same reasons just explained above, said storage units in turn will be little saturated.

Another drawback is represented by the fact that the scarce saturation of the storage unit means longer paths of the mechanical devices that connect and replace the reels among the compartments of the accumulation structure, with a consequent increase of movement times and thus of handling costs.

A storage unit of the type just described above is described in the patent document EP 2 792 619 and concerns a storage unit for reels comprising an accumulation structure in which there are a plurality of compartments defined by parallel shelves that are spaced vertically and permanently fixed to vertical walls.

The compartments have different sizes and the reels are inserted in/extracted from them through moving means of the Cartesian type.

From said document it can be understood that the storage unit described therein poses all the drawbacks and limitations already illustrated above, in fact, since it is provided with fixed shelves, the sizes of the compartments defined by said shelves are pre-established during the design step and cannot be changed once the storage unit has been completed.

This leads to low saturation of the available storage volume as, for example when it is necessary to store a very high number of small reels compared to the availability of compartments suited to house them, the user is forced to temporarily place the excess reels in the larger compartments and to successively move them to compartments of the suitable size, if and when these should become available.

Another known patent document concerning storage units of the type described up to now is document EP 1 928 221 which discloses an accumulator device for electronic components, suited to be used for storing reels of electronic components inside compartments present in accumulation storage units.

The document describes only compartments present in the storage unit and suited to accommodate the reels, but does not contain any information regarding the configuration of said storage unit and of said compartments.

The patent document EP 0 302 542 is also known, which describes a piece of equipment for the selection of shelves with objects placed on them and the transport of the same among movable accumulation storage units in which said shelves are supported by sliding guides fixed to the side walls of the storage unit.

The shelves with the objects placed on them have all the same height and are arranged vertically one on top of the other and equidistant from each other. The shelves and the sliding guides are thus structured only to allow the shelves to be removed and transferred between different storage units by means of a selection device.

The document, therefore, does not describe any solution for modifying the position of the shelves according to the different sizes of the objects placed on them in order to optimize the saturation of the storage volume available in the storage unit.

Also the patent document DE 20 2004 006920 describes a storage unit for reels comprising an accumulation structure in which there are a plurality of compartments in/from which the reels are inserted/extracted through gripping means with Cartesian movement.

In each compartment there are reel supporting elements that are fixed to the side walls and the back walls defining the bearing structure of the storage unit. The storage unit described in the last patent document is thus provided with compartments having a fixed size and therefore has the same limitations already observed in the storage unit disclosed by the patent document EP 0 302 542 analysed above, with the further limitation that all of the compartments have the same height.

Storage units are also known in which the shelves defining the compartments that accommodate the reels are removable and their position can be changed in such a way as to vary the height of the compartments they define.

The limitation of the storage units of this type lies in that they are supplied to the user complete with shelves that define a plurality of compartments already configured according to a predefined mix of different heights, possibly established in advance according to the user's needs.

If on the one hand these solutions make it possible to improve the saturation of the storage unit, on the other hand they pose a drawback constituted by the complexity of the operation that the user needs to carry out in order to change the position of the various shelves when he/she deems it necessary to modify the size of the compartments.

In these cases, in fact, the user needs to access the containment structure, remove the shelves that must be removed and place them in the new position as desired.

It can be understood that this operation is rather complex and that, furthermore, the storage unit cannot be used while it is being performed.

SUMMARY OF THE INVENTION

The present invention intends to provide a storage unit that makes it possible to overcome all of the drawbacks illustrated above.

It is thus a first object of the invention to provide a storage unit for reels that, compared to equivalent storage units of the known art, ensures increased saturation of the storage volume available in the storage unit itself.

It is another object of the invention to provide a storage unit that, while providing the same storage volume as the storage units of the known art, allows the user to increase both the number and the types of reels in various heights that can be stored therein, and therefore substantially to optimize the volume available in the storage unit.

It is a further object of the invention to provide a storage unit in which the optimization of the storage volume can be obtained with no need to modify the position of structural parts of the storage unit as, on the contrary, is the case with the storage units of the known art.

It is another, yet not the least important object of the invention to provide a storage unit that, compared to the equivalent storage units of the known art, ensures reduced reel handling costs and times both in the collection and in the replacement steps.

The objects listed above are achieved by a storage unit having the characteristics described in the main claim, to which reference is made.

Essentially, in the storage unit of the invention each reel is accommodated in a housing obtained in the respective tray and the compartments that accommodate the trays are not prepared in advance during production of the storage unit, but are defined in a dynamic manner while the trays are being placed in the accumulation structure.

In other words, each tray is inserted in the storage unit only once each reel has been placed on it in the respective housing, through operations that are performed outside of the storage unit itself.

In addition to the above, every time a tray with one or more reels is extracted from the storage unit, the reels are collected and the tray remains empty outside the storage unit, until it is reintroduced therein once one or more new reels have been placed on it.

Advantageously, the storage unit that is the subject of the invention is provided with electronic processing and control means suited to manage the placement and the collection of the trays with the respective reels in/from the storage unit, thus optimizing the exploitation of the available volume.

Still advantageously, the increased saturation of the storage unit and the shortening of the paths covered by the means that collect and place the trays with the respective reels lead to a reduction in execution times and costs.

BRIEF DESCRIPTION OF THE DRAWINGS

The objects and advantages described above are highlighted in greater detail in the description of a preferred, yet not exclusive embodiment of the invention, which is provided here below by way of example without limitation, with reference to the attached drawings, wherein:

FIG. 9 shows a view of another detail of the assembly of FIG. 5;

FIGS. 10 to 12 show three different views of the detail of FIG. 9;

DETAILED DESCRIPTION OF THE PREFERRED EMBODIMENTS

The storage unit that is the subject of the invention is shown in different views in FIGS. 1 to 4, where it is indicated as a whole by 1.

It is configured to store objects O having a mainly plane bidimensional shape, especially tapes wound in reels, on which electronic components for the assembly of electronic boards are inserted.

As can be observed, the storage unit comprises a containment structure 2 that is provided with an opening 3 and with a loading compartment 2a through which it is possible to access from the outside an accumulation structure 4 arranged inside the containment structure 2.

Figure 2:
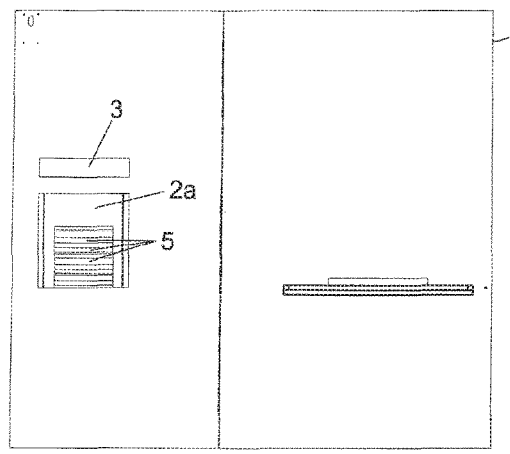
FIGS. 2 to 4 show three views of the storage unit of FIG. 1, respectively a front external view, a side internal view and a top internal view.
Figure 3:
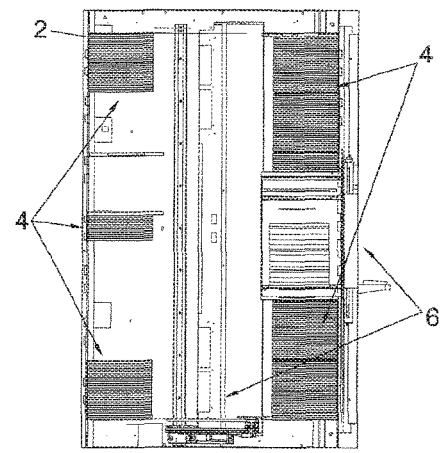
Figure 4:
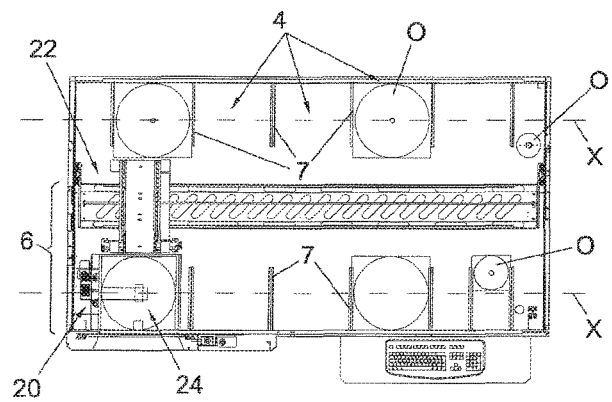
Figure 1:
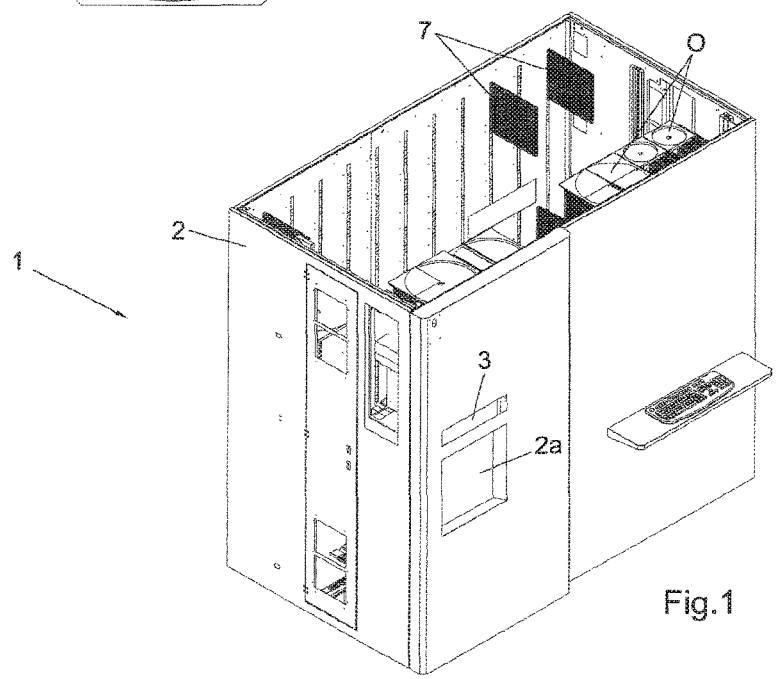
FIG. 1 shows an axonometric view of the storage unit that is the subject of the invention.
Figure 5:
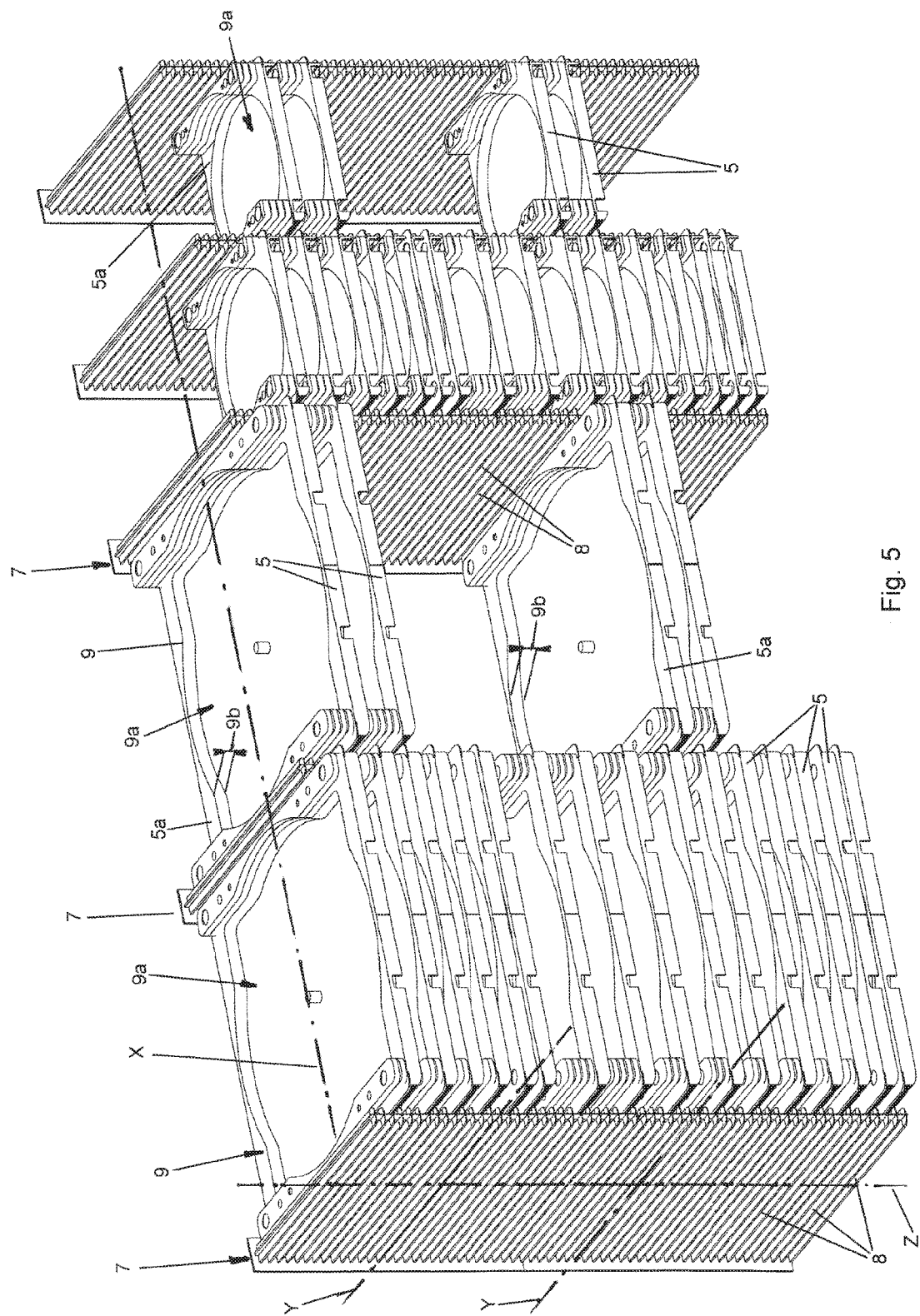
FIG. 5 shows an axonometric view of an internal detail of the storage unit of FIG. 1.

The accumulation structure 4 is visible in FIGS. 1, 3 and 4 and one of its parts is illustrated in detail in the axonometric view of FIG. 5.

The accumulation structure 4 develops along the inner walls of the containment structure 2 and can be accessed through the moving means 6 that serve for the insertion and collection of the objects O in/from the accumulation structure 4.

The objects O can be made available to the moving means 6 at the level of the opening 3 and of the loading compartment 2a obtained in the containment structure 2 that will be illustrated during the description of the operation of the storage unit.

According to the invention, the accumulation structure 4 comprises a plurality of vertical walls 7 that face and are spaced from each other and are aligned one after the other along a first horizontal direction X that is orthogonal to the vertical walls 7 themselves.

The accumulation structure 4 comprises also a plurality of guide means 8 that are present in at least one of the surfaces delimiting each one of the vertical walls 7 and are configured so as to define second horizontal directions Y parallel to one another and orthogonal to the first horizontal direction X.

Finally, the accumulation structure 4 is configured so as to accommodate a plurality of trays 5, in each one of which it is possible to identify a shaped housing 9 configured so as to accommodate an object O.

According to other embodiments of the invention, each tray 5 may be provided with two or more housings, each one of which is suited to accommodate an object O.

Figure 8:
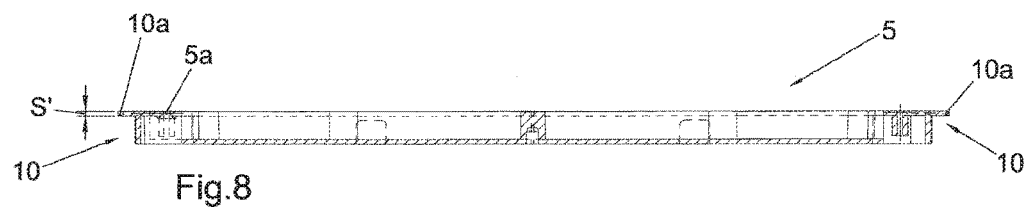
FIGS. 7 and 8 show two views of the detail of FIG. 6, respectively a top view and a side view.
Figure 7:
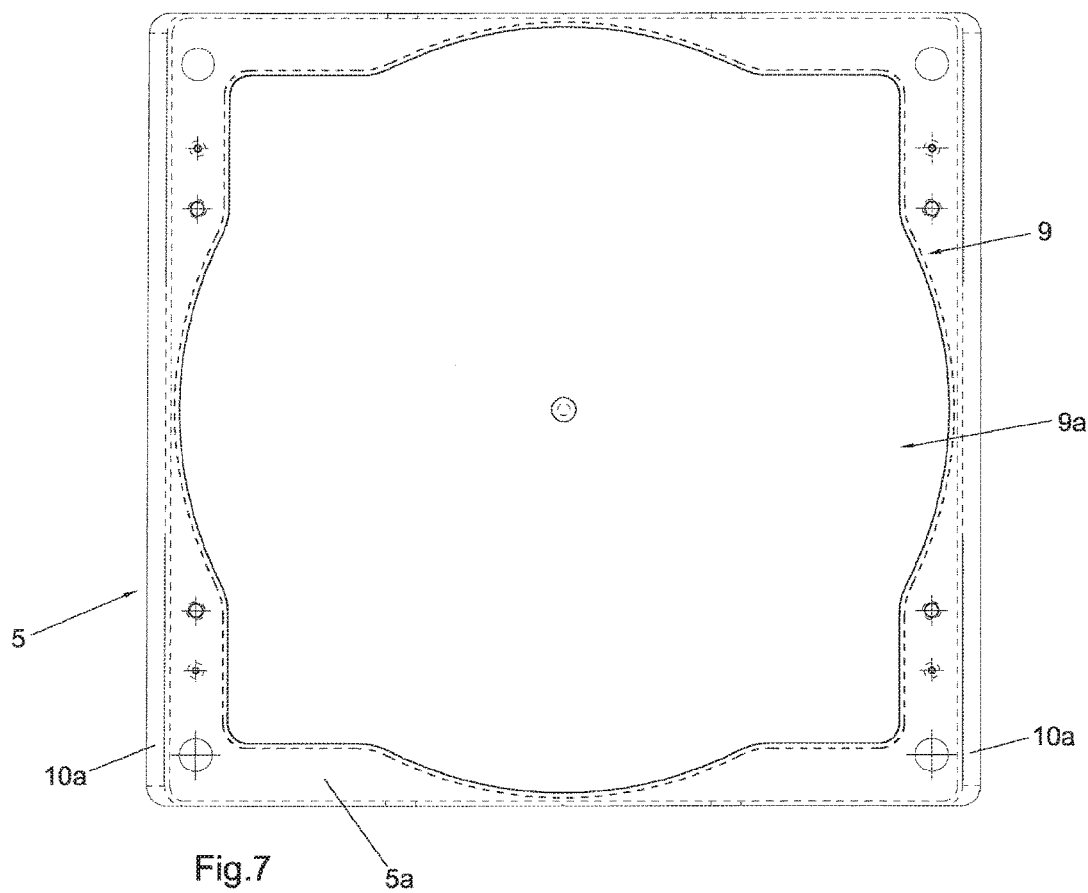
Figure 6:
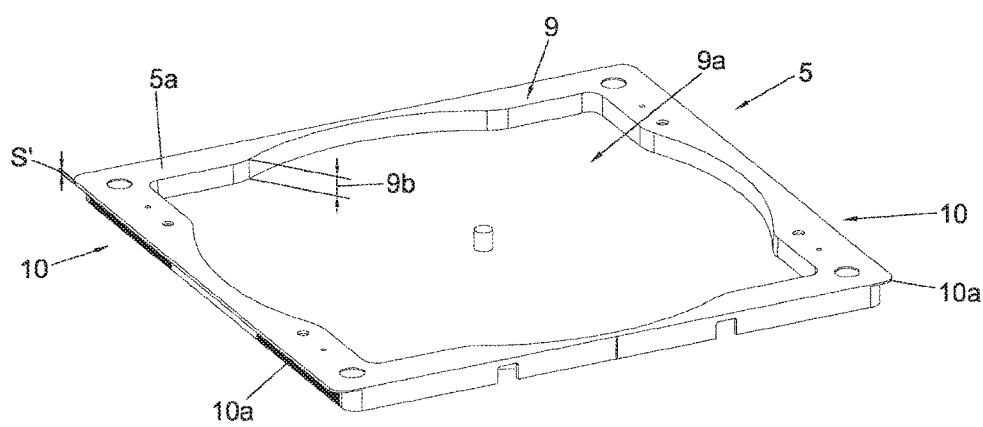
FIG. 6 shows an axonometric view of a detail of the assembly of FIG. 5.
Figure 13:
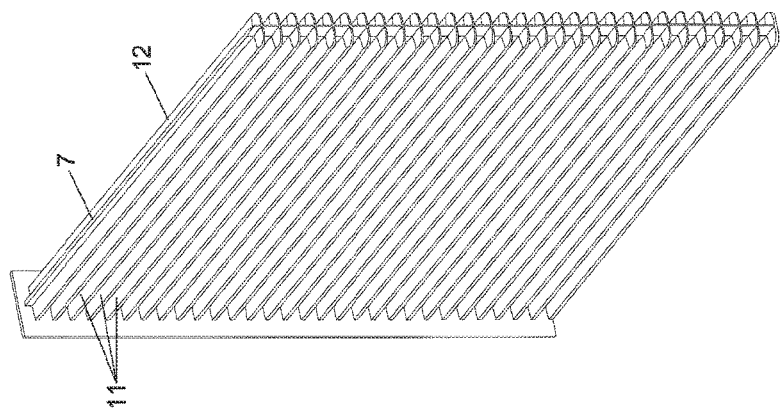
FIG. 13 shows an axonometric view of another detail of the assembly of FIG. 5.
Figure 15:
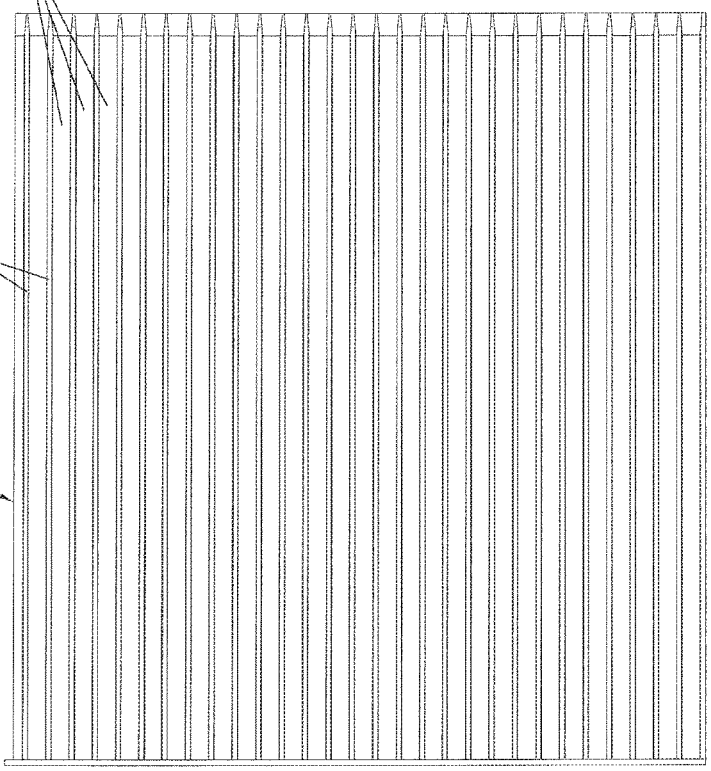
FIGS. 14 to 16 respectively show a top view, a front view and a side view of the detail of FIG. 13.
Figure 14:
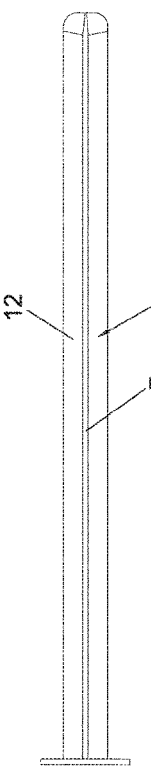
Figure 16:
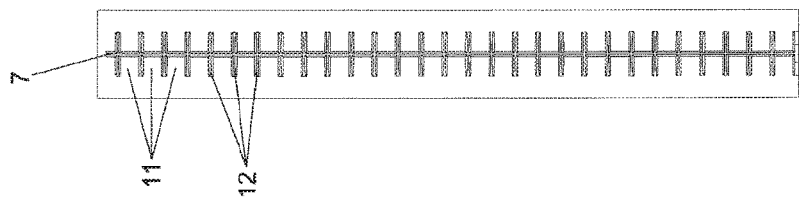
Figure 17:
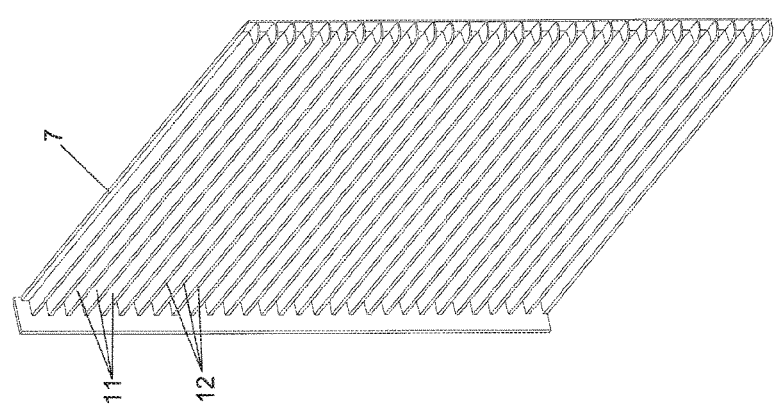
FIG. 17 shows an axonometric view of a variant embodiment of the detail of FIG. 13.
Figure 19:
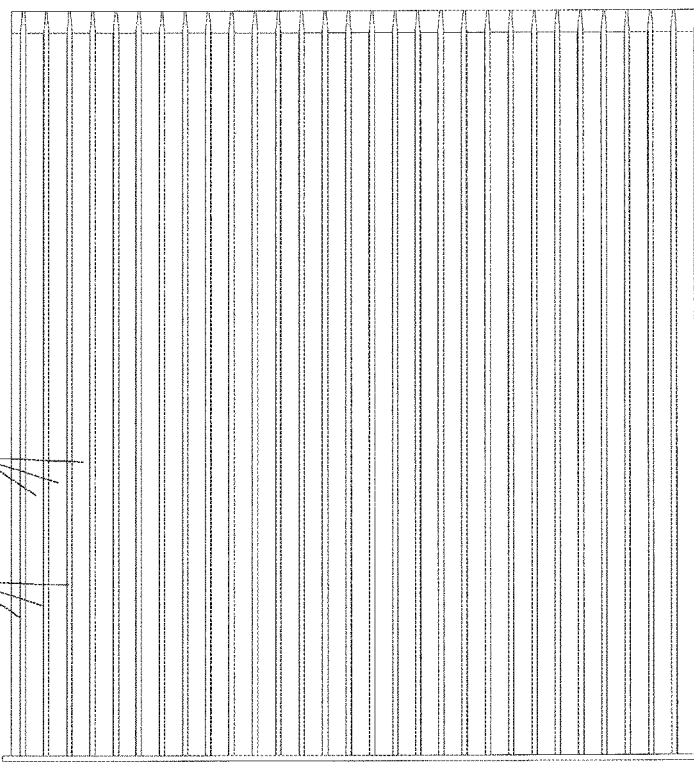
FIGS. 18 to 20 respectively show a top view, a front view and a side view of the detail of FIG. 17.
Figure 18:
Figure 20:
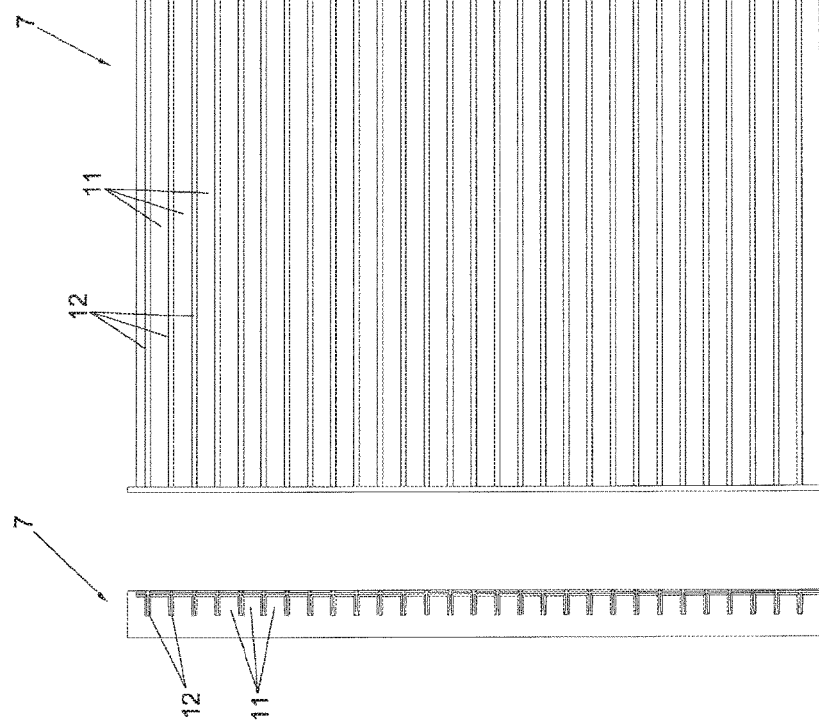

The trays 5 are made in various sizes, as can be observed for example in FIG. 5, and each one of them, as can be observed in FIGS. 7 and 8, is provided with shaped edges 10 that are parallel to each other and arranged on the opposite sides of the tray 5.

Each one of said shaped edges 10 is configured in such a way that it can be slidingly coupled in a corresponding one of the above mentioned guide means 8 when the tray 5 is inserted between any two of said consecutive vertical walls 7 facing each other.

As far as the guide means 8 are concerned, it can be observed, with particular reference to FIGS. 13 to 22, that they comprise a plurality of recesses 11 and a plurality of projections 12 that alternate one after the other and develop on one or both of the surfaces of each vertical wall 7 along the already mentioned second horizontal directions Y.

In this way, one or both of the surfaces of the vertical wall 7 have a lined appearance that substantially recalls a comb-shaped structure.

In particular, if the vertical wall 7 is arranged in an intermediate position with respect to others, both of its surfaces are provided with the guide means 8, as shown in FIGS. 13 to 16.

If, vice versa, the vertical wall 7 is arranged at the end of a series of other walls parallel to it, only one of its surfaces is provided with the guide means 8, as can be observed in FIGS. 17 to 20.

Said guide means 8 are thus configured so as to accommodate the shaped edges 10 of each tray 5, wherein, as shown in FIGS. 7 and 8, each shaped edge 10 comprises a projecting tab 10a that protrudes on the outside of the tray itself.

Figure 21:
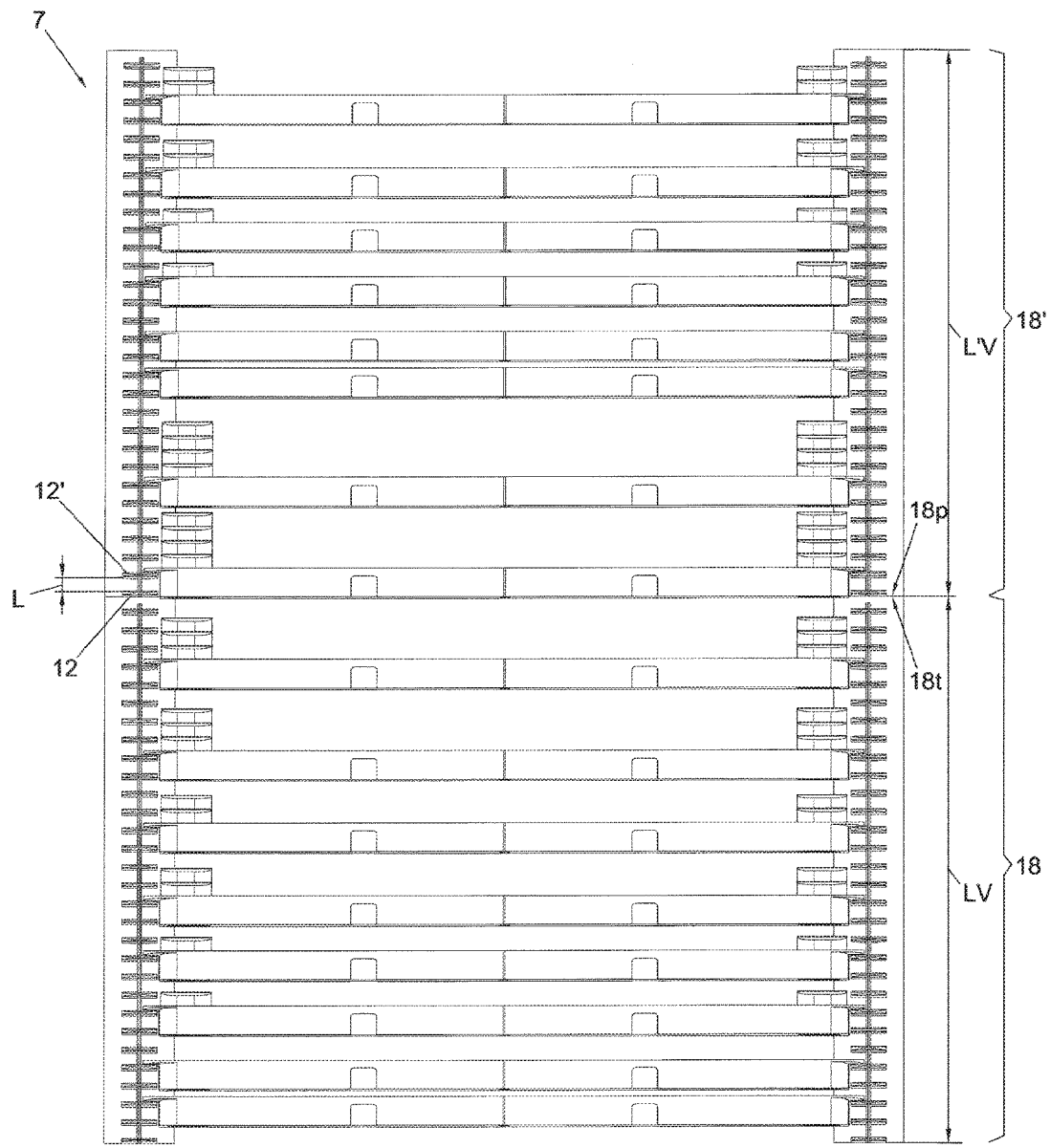
FIG. 21 shows the front view of a detail of the assembly of FIG. 5.
Figure 22:
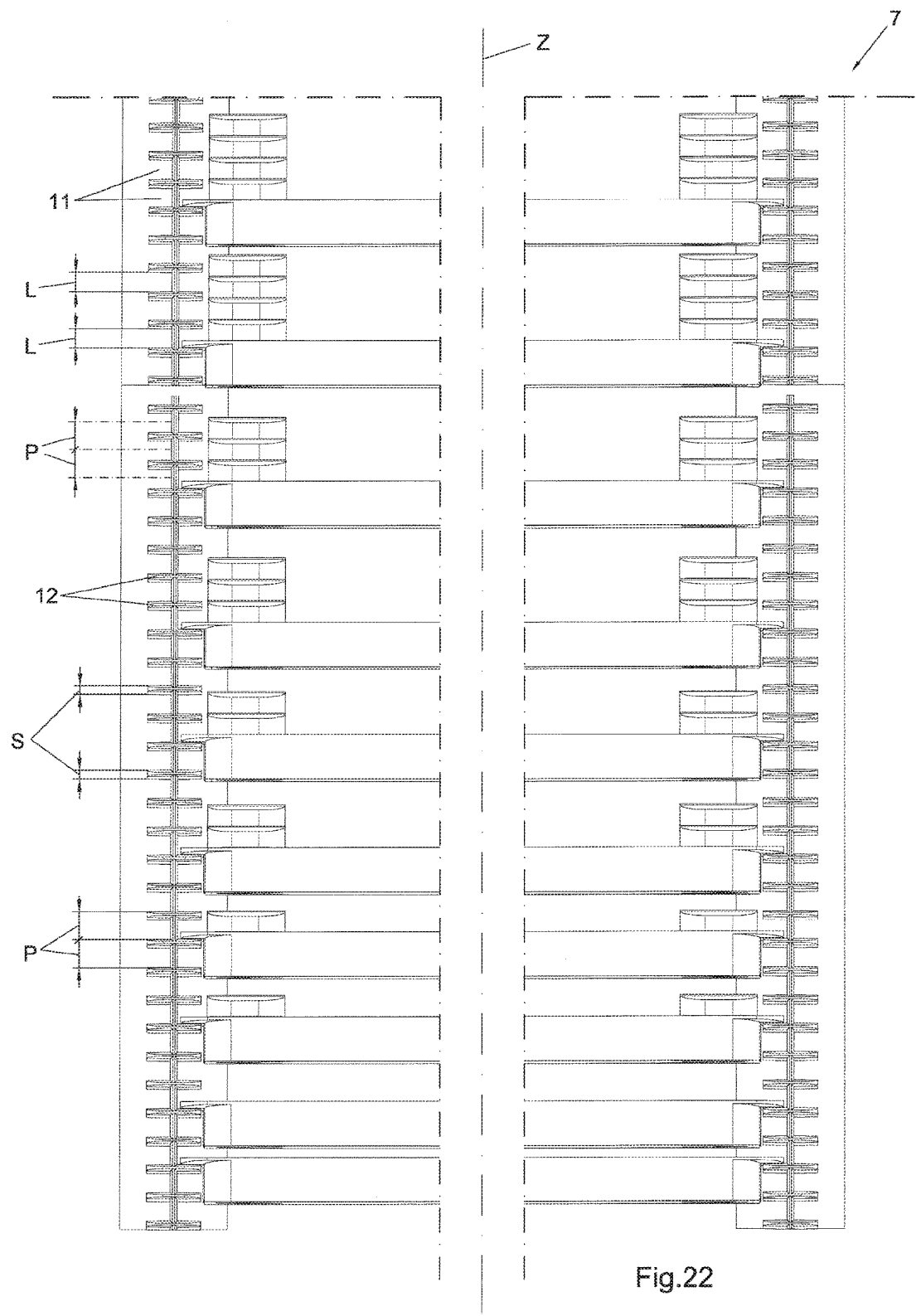
FIG. 22 shows an enlarged detail of FIG. 21.

It can furthermore be observed, with particular reference to FIGS. 21 and 22, that all of the recesses 11 have the same length L and the same pitch P and all of the projections 12 have the same thickness S, wherein the length L, the pitch P and the thickness S are measured along a vertical direction Z that develops parallel to the vertical wall 7 and is orthogonal to the second horizontal directions Y.

As far as the trays 5 are concerned, the shaped housing 9 comprises a shaped cavity 9a provided in the tray 5 starting from its upper surface 5a.

The thickness of the object O that is accommodated in the shaped cavity 9a must be smaller than or in any case must not exceed the depth 9b of the shaped cavity itself, in such a way as not to protrude from the upper surface 5a of the tray 5.

It can be understood, in fact, that if the object O should project from the upper surface 5a of the tray 5, when the tray 5 on which it is arranged is in turn inserted in the accumulation structure 4, the object O could counteract any overlying tray already present in the accumulation structure 4.

If it should be necessary to house in the shaped cavity 9a objects whose height exceeds the depth 9b of the shaped cavity 9a and therefore to avoid the possible interference mentioned above when the tray 5 is inserted in the accumulation structure 4, each tray 5 is configured in such a way that it can receive on its upper surface 5a one or more spacer elements 15, one of which is represented in three different views in FIGS. 9 to 12.

The spacer elements 15 are configured in such a way that they can be superimposed and connected to one another and to the upper surface 5a of the tray 5 through removable connection means indicated as a whole by 16 which, as can be observed, comprise one or more holes 16b belonging to the upper surface 5a and/or to each one of the spacer elements 15 and corresponding pins 16a that belong to the spacer elements 15 and/or to the upper surface 5a.

The pins 16a and the holes 16b, furthermore, are configured so that the former can be removably snap-fitted into the latter, if necessary even through a screw fastening.

In this way, by applying one or more spacer elements 15 to each tray 5 it is possible to define for the shaped cavity 9a a depth that is sufficient to accommodate the entire height of the object O that is placed therein.

In order to optimize the storage volume available in the accumulation structure 4, the height H of each one of the spacer elements 15, measured between the two parallel external sides 15a, 15b that delimit it, is defined so that it is shorter than or equal to the length L of each one of the recesses 11.

Furthermore, the thickness S' of each one of the projecting tabs 10a of each tray 5 is defined so that it is equal to the thickness S of the projection 12.

In this way, the measurements of the height H of each one of the spacer elements 15, of the thickness S of the projections 12 and of the pitch between the recesses 11 are correlated with one another according to the following relation:

$$H+S \leq P$$

Furthermore, the measurements of the height H of each one of the spacer elements 15 and of the length L of the recesses 11 are correlated with one another according to the following relation:

$$H \leq L$$

When these two conditions are met, every time that a spacer element 15 is applied to the tray 5 an additional volume is occupied in the accumulation structure 4, wherein said additional volume, compared to the volume occupied by the tray 5 only, does not exceed that of a pitch P between two successive recesses 11.

This situation is clearly illustrated in FIGS. 21 and 22, in which it can be observed that when only one spacer element 15 is applied to a tray 5, the dimension of the latter in the direction Z does not extend beyond the projection 12 following the projection on which the projecting tab 10a of the tray 5 rests and therefore corresponds to a pitch P.

In fact, the measurement of the thickness S of the projecting tab 10a added to the measurement of the height H of the spacer element 15 corresponds exactly to the measurement of the pitch P between the recesses 11.

If, instead, two spacers 15 are applied to the tray 5, the former occupy in the accumulation structure 4 an additional volume corresponding to two recesses 11 and smaller than two pitches P, three spacers 15 occupy an additional volume corresponding to three recesses 11 and smaller than three pitches, and so on.

The optimization of the volume available in the accumulation structure 4 is thus obtained.

It can be understood that the use of the spacers 15 having all the same height H, whose value meets the conditions expressed by the relations indicated above, facilitates the placement of the reels in the trays 5.

In fact, when a reel projects from the upper surface 5a of the tray 5 in which it is housed, it is sufficient for the operator to apply to the tray 5 a number of superimposed spacers 15 that has to be at least sufficient to equal the value of the projection length, in order to ensure that the tray 5, once introduced in the storage unit, does not counteract other trays that should successively be stored over it.

Furthermore, should spacers 15 be applied to the tray 5, they can be easily identified by detection means belonging to the moving means 6, as is described in greater detail below.

As far as the vertical walls 7 are concerned, each one of them, as can be observed in FIGS. 21 and 22, is constituted by one or more vertical elements 18, 18' that are aligned vertically on top of each other, wherein the length Lv, L'v of each vertical element is an integral multiple of the pitch P between the recesses 11 according to the following relation:

$$Lv=n \times P$$

where n is an integer.

In this way, also the total height of the accumulation structure 4 is optimized since, as shown always in FIGS. 21 and 22, when the foot 18p of each vertical element 18' is superimposed to the head 18t of the underlying vertical element 18, the two consecutive terminal projections 12, 12' respectively belonging to the vertical element 18 and to the vertical element 18' define together a recess 11 with length L.

Concerning the moving means 6, they are shown in an enlarged view in FIGS. 23 to 27 and comprises a lifting unit 20 suited to lift the trays 5 and arranged in a compartment 2a obtained in the containment structure 2 and suited to be accessed by an operator from the outside.

The trays 5 are arranged on the lifting unit 20 one on top of the other and are lifted until they are arranged in succession, one after the other, at the level of the opening 3.

There is also a Cartesian robot 22 that is arranged inside the containment structure 2 and is provided with moving and gripping means 23 configured so as to collect/deposit each one of the trays 5 from/on the lifting unit 20, through the opening 3, and to deposit/collect it in/from the accumulation structure 4. Measuring means 24 are also provided, which are suited to measure the height of each one of the trays 5, the number of spacers 15, if present, and the height of one or more of the objects O contained in the tray 5 with respect to a fixed point of reference.

Finally, programmable electronic means are provided that are suited to manage the movements of the Cartesian robot 22 based on the measurements made by the measuring means 24 and on the processing of the relations described above.

Figure 23:
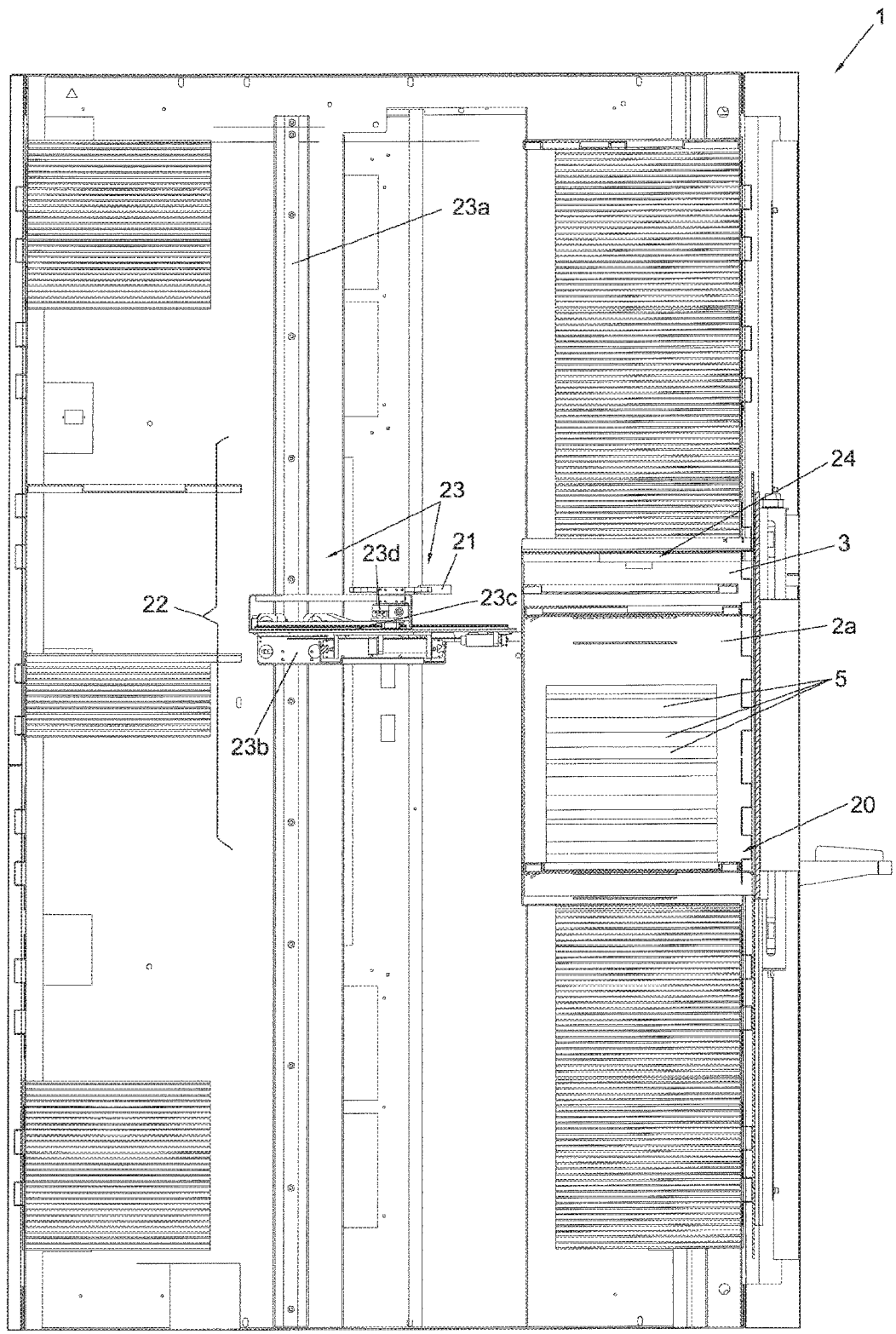
FIGS. 23 to 27 show different views of the storage unit of the invention in different operating stages.
Figure 24:
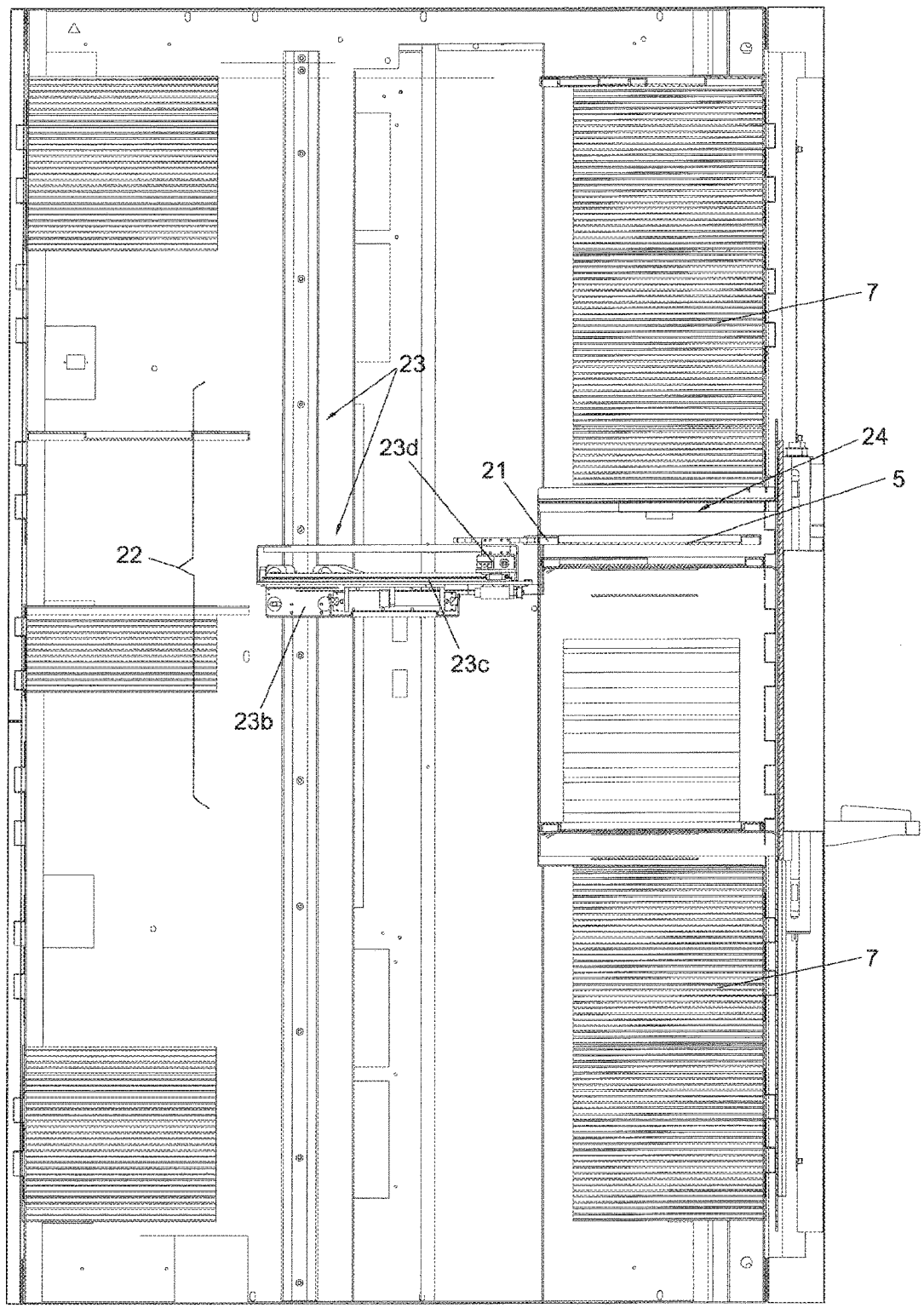

In practice, once the trays 5 containing the respective objects O and provided with spacers 15, if present, have been placed on the lifting unit 20, as can be observed in FIG. 23, the tray 5 at the head of the stack is arranged at the level of the opening 3, as shown in FIG. 24, where it is collected by the moving and gripping means 23.

In particular, the moving and gripping means 23 comprise one pair of vertical uprights 23a that support a first slide 23b moving vertically along the vertical uprights 23a, a second slide 23c moving horizontally on the first slide 23b and parallel to the accumulation structure 4 and a third slide 23d provided with gripping tongs 21 and moving on the second slide 23c crosswise with respect to the accumulation structure 4.

The moving means 6 thus assume the typical configuration of a Cartesian robot of the known type.

Figure 25:
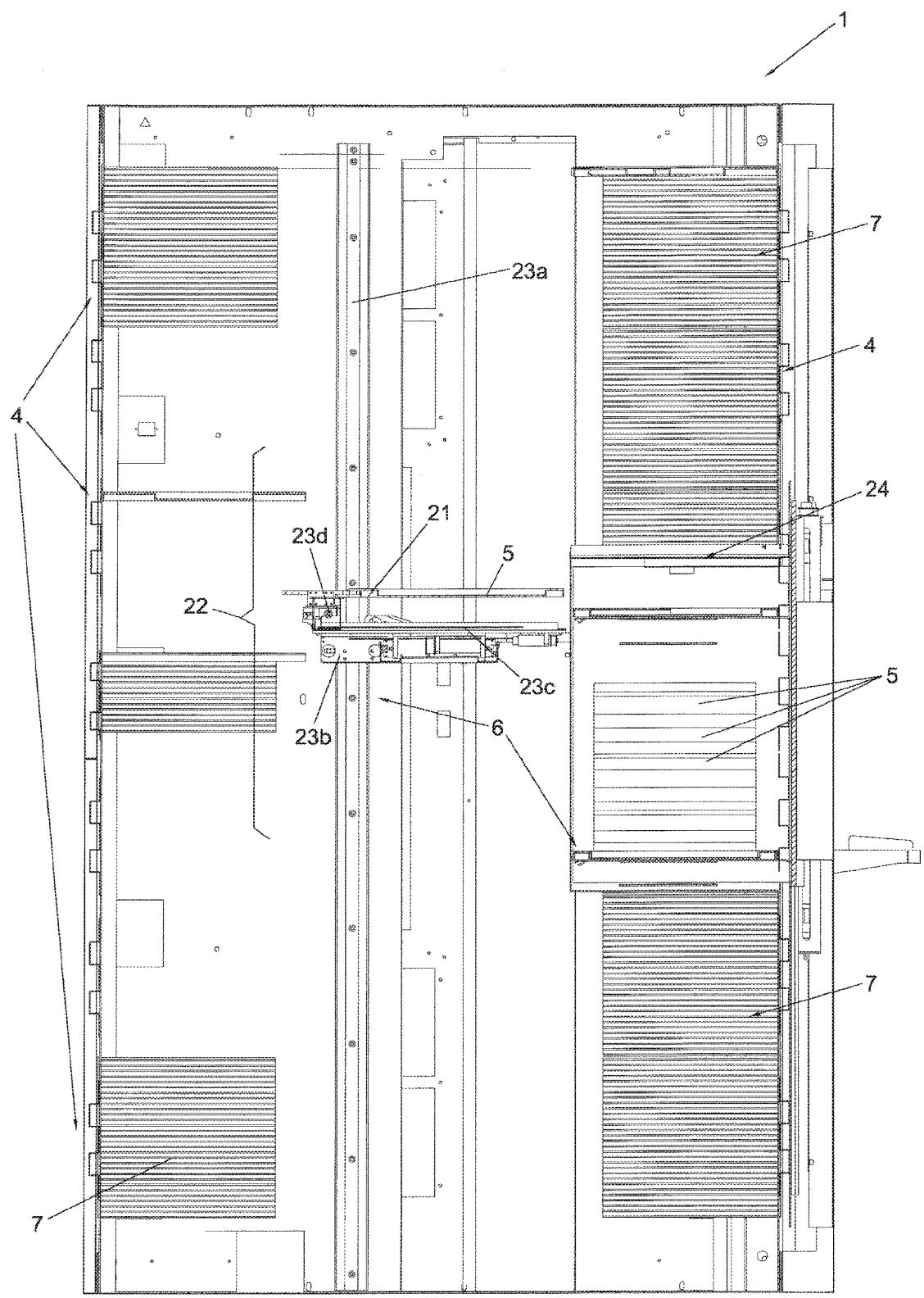
Figure 26:
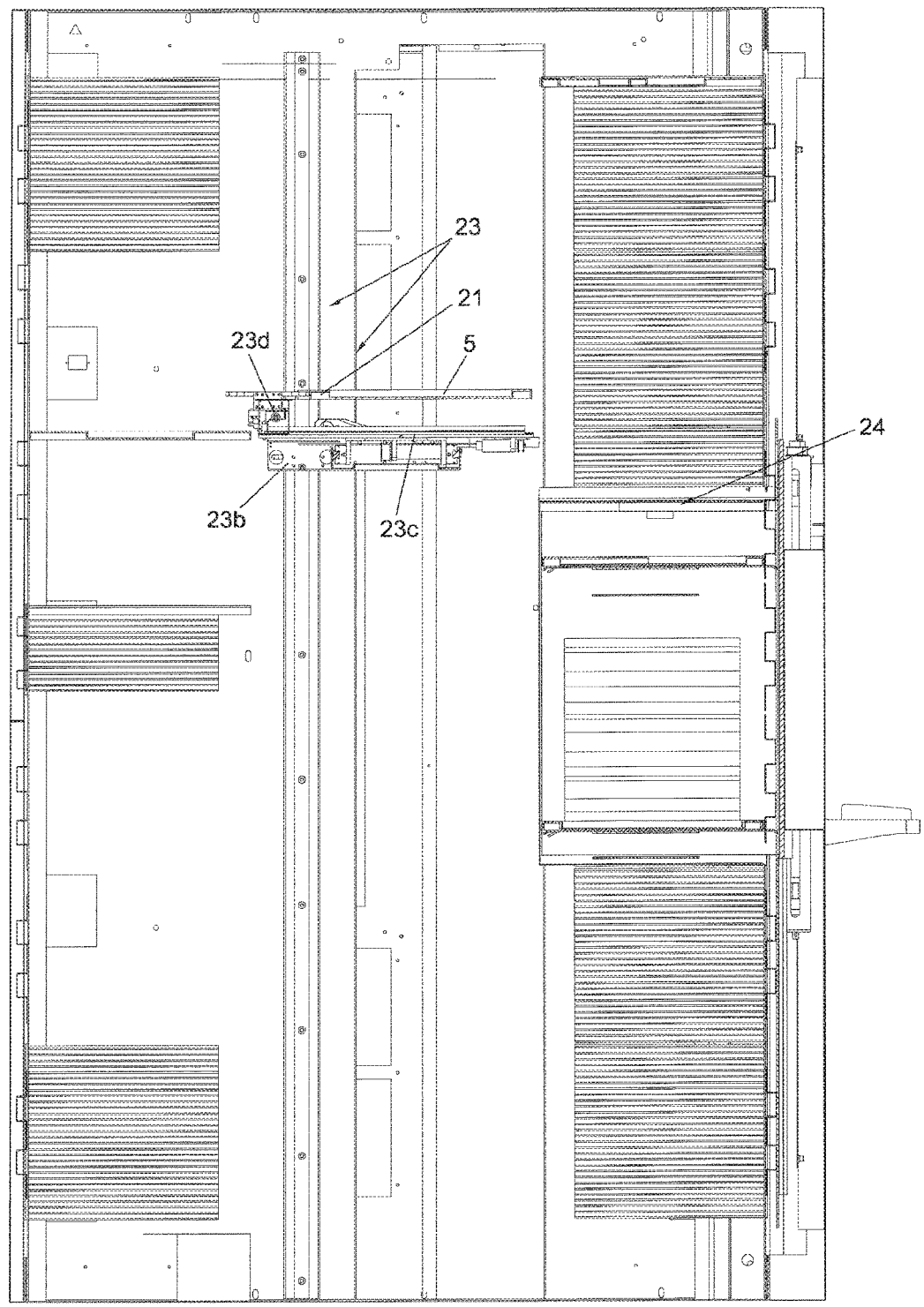
Figure 27:
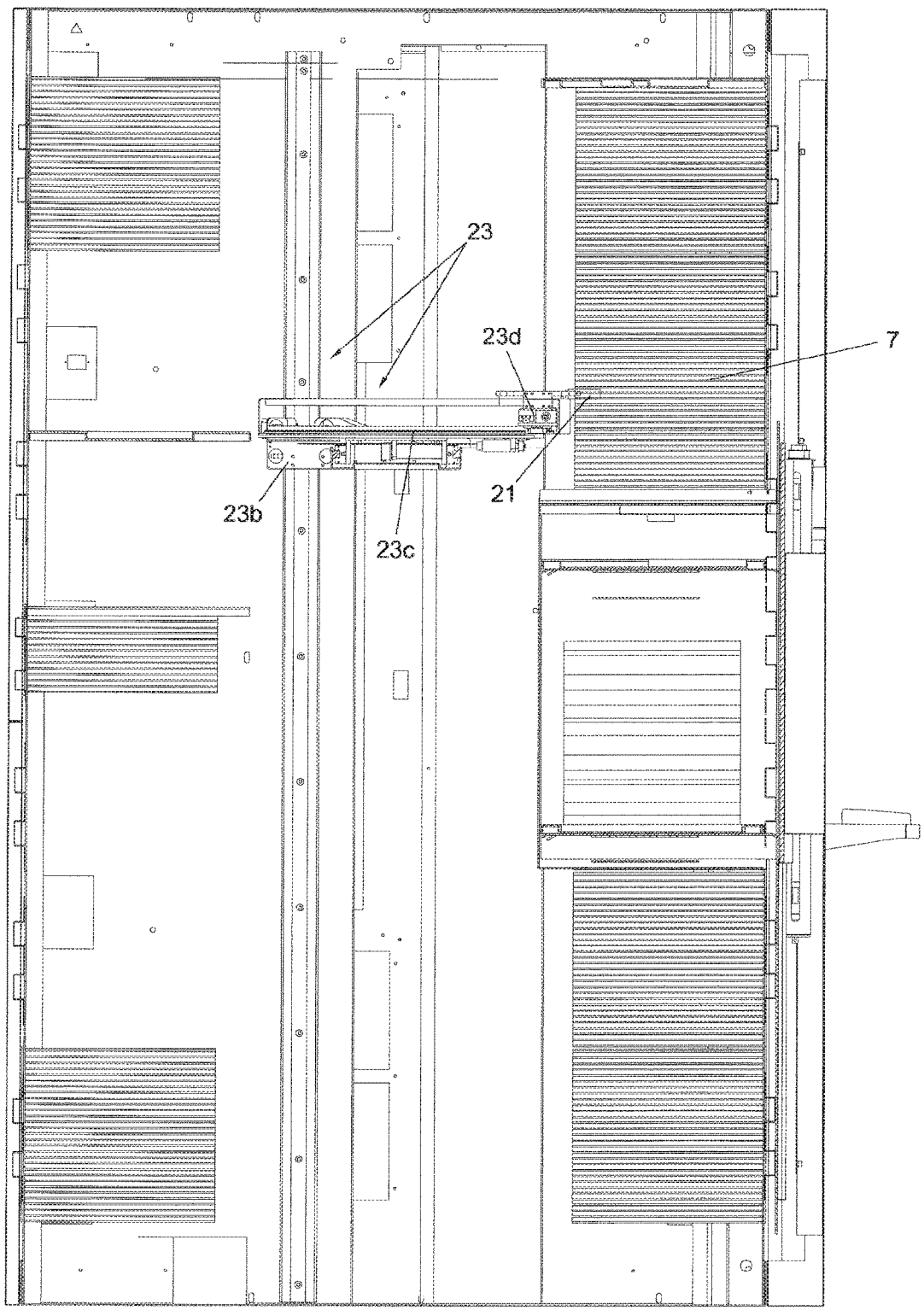

The tray 5 collected by the gripping tongs 21 is then moved backwards in the horizontal direction so as to withdraw it from the opening 3, as shown in FIG. 25, and through a successive movement, for example a lifting movement as shown in FIG. 26, it is arranged at the front of the accumulation structure 4 in which it is inserted with a horizontal movement, as shown in FIG. 27.

The position in which the tray 5 is inserted is selected by the management system of the moving means 6, which selects the best position with respect to the already placed trays, whose position will have been previously stored by the system itself for the purpose of optimizing the storage capacity of the storage unit.

In particular, if the tray 5 is provided with spacers 15, since they all have the same height H, the management system can determine the overall height of the tray 5 through a simple calculation of the number of spacers present made by the measuring means 24.

Successively, the same management system, through the processing of the mathematical relations described above, will identify the best position for the tray 5 with respect to the trays that are already present.

In this way, each tray 5 that is inserted is placed in the optimal position, in order to guarantee at any moment the optimal saturation of the storage unit.

The operations described above are repeated until all of the trays 5 stacked on the lifting unit 20 have been inserted in the accumulation structure 4.

Obviously the same operations, carried out in the reverse order with respect to the described sequence, serve to collect the trays 5 one at a time through the gripping tongs 21 of the accumulation structure and to deposit them, stacked on one another, on the lifting unit 20 so that they are at the disposal of the operator.

Obviously, the management system described herein is just one of the possible management systems for practically exploiting the presence of spacers 15, if any, applied to the trays 5 in order to ensure the optimal saturation of the storage unit volume.

According to the above, it can be understood that the storage unit that is the subject of the invention achieves all of the set objects.

It has been shown that, thanks to the use of the trays that support the objects to be stored, the formation of the storage unit occurs in a dynamic manner, while the trays are being inserted in the accumulation structure that supports them.

Furthermore, the possibility to apply spacer elements to the trays makes it possible to obtain the optimal saturation of the storage unit, especially when it is necessary to store reels whose thickness exceeds the depth of the housing in which they are accommodated, or when several superimposed reels are arranged on the same tray.

The use of the spacers, as already explained, facilitates and speeds up the operator when it is necessary to prepare trays intended to accommodate reels whose thickness exceeds the depth of the housing in which they are placed or to accommodate several superimposed reels.

In particular, since the compartments that house the trays are defined dynamically during the placement of the trays themselves inside the accumulation structure, it is possible to obtain increased saturation of the storage volume available in the accumulation structure compared to the equivalent storage units of the known art.

In this way, it is possible to achieve also the further object to increase the number and the types of reels stored, while providing the same storage volume as that available in the storage units of the known art.

Finally, the invention also achieves the object to reduce the paths covered when handling the reels and therefore to reduce operating times and consequently management costs.

In the construction stage, the storage unit that is the subject of the invention may undergo changes and modifications that are neither described nor illustrated herein.

In particular, the storage unit of the invention can use trays configured in various manners, so as to make it possible to accommodate and store objects having any shape, even if they do not have a mainly plane bidimensional shape.

Thus, for example, it will be possible to provide trays configured so that they can house several objects in different sizes and shapes.

Furthermore, in the storage unit of the invention the operations for loading and unloading the trays and optimizing their placement in the accumulation structure can be carried out through automatic computer-controlled management systems.

It is understood, however, that any variant of or modification to the storage unit that is the subject of the invention must in any case be considered protected by the present patent, provided that it falls within the scope of the claims expressed below.

The invention claimed is:

1. A storage unit configured for the storage of objects, comprising:
    a containment structure provided with at least one opening that communicates with the external environment, wherein said containment structure houses the following:
        an accumulation structure suited to accumulate a plurality of said objects, comprising a plurality of vertical walls spaced from and facing each other and aligned one after the other along a first horizontal direction that is orthogonal to said vertical walls;
        a plurality of guide means present on at least one of the surfaces delimiting each one of said vertical walls and configured so as to define second horizontal directions parallel to one another and orthogonal to said first horizontal direction, said guide means comprising a plurality of recesses and a plurality of alternating projections arranged one after the other and developing along said second horizontal directions in such a way as to give a lined appearance to each one of said surfaces of said vertical wall;
        a plurality of trays, in each one of which it is possible to identify:
            at least one shaped housing comprising a shaped cavity provided in said tray (5) starting from its upper surface, said shaped cavity being configured to accommodate at least one of said objects;
            shaped edges parallel to each other, arranged on opposite sides of said tray and each comprising at least one projecting tab, configured so that they can be slidingly coupled in said guide means when said tray is inserted between any two of said consecutive vertical walls;
        moving means suited to move said trays with said objects, said moving means being configured so as to access said accumulation structure and said opening and to insert/extract said trays in/from said guide means,
    further comprising spacer elements suited to be superimposed to one another and to the upper surface of said tray and connection means suited to removably connect said spacer elements to one another and to said upper surface to vary the depth of said shaped housing of each one of said trays, wherein
    the measurements of the height of each one of said spacer elements and of the length of said recesses are correlated with each other according to the relation $H \leq L$,
    all of said recesses have the same length and the same distance, and all of said projections have the same thickness which is equal to the thickness of said projecting tabs, said length, said height, said distance and said thicknesses being measured along said vertical direction parallel to said vertical walls and orthogonal to said second horizontal directions.

2. The storage unit according to claim 1, wherein the removable connection means comprise one or more pins belonging to said upper surface or to each one of said spacer elements and corresponding holes belonging to said spacer elements or to said upper surface, said pins being configured so that they can be removably snap-fitted into said holes.

3. The storage unit according to claim 2, wherein the measurements of the height of each one of said spacer elements, of the thickness of each one of said projecting tabs and of the pitch of said recesses are correlated with one another according to the relation: H+S'≤P.

4. The storage unit according to claim 2, wherein the measurements of the height of each one of said spacer elements, of the thickness of each one of said projections and of the pitch of said recesses are correlated with one another according to the relation: H+S≤P.

5. The storage unit according to claim 1, wherein the measurements of the height of each one of said spacer elements, of the thickness of each one of said projecting tabs and of the pitch of said recesses are correlated with one another according to the relation: H+S'≤P.

6. The storage unit according to claim 5, wherein the measurements of the height of each one of said spacer elements, of the thickness of each one of said projections and of the pitch of said recesses are correlated with one another according to the relation: H+S≤P.

7. The storage unit according to claim 5, wherein the moving means comprise:
   a lifting unit suited to lift said trays and arranged in a compartment obtained in said containment structure and suited to be accessed by an operator from the external environment;
   at least one Cartesian robot arranged inside said containment structure and comprising moving and gripping means configured so that they can collect/deposit each one of said trays from/on said lifting unit through said opening and deposit/collect it in/from said accumulation structure;
   measuring means suited to measure the height of each one of said trays with said one or more spacers, if any, and of each object contained in it;
   programmable electronic means suited to manage the movements of said Cartesian robot.

8. The storage unit according to claim 2, wherein each one of said vertical walls comprises one or more vertical elements aligned vertically on top of one another, the measurement of the length of each one of said vertical elements being an integral multiple of said pitch of said recesses.

9. The storage unit according to claim 5, wherein each one of said vertical walls comprises one or more vertical elements aligned vertically on top of one another, the measurement of the length of each one of said vertical elements being an integral multiple of said pitch of said recesses.

10. The storage unit according to claim 1, wherein the moving means comprise:
    a lifting unit suited to lift said trays and arranged in a compartment obtained in said containment structure and suited to be accessed by an operator from the external environment;
    at least one Cartesian robot arranged inside said containment structure and comprising moving and gripping means configured so that they can collect/deposit each one of said trays from/on said lifting unit through said opening and deposit/collect it in/from said accumulation structure;
    measuring means suited to measure the height of each one of said trays with said one or more spacers, if any, and of each object contained in it;
    programmable electronic means suited to manage the movements of said Cartesian robot.

11. The storage unit according to claim 1, wherein each one of said vertical walls comprises one or more vertical elements aligned vertically on top of one another, the measurement of the length of each one of said vertical elements being an integral multiple of said pitch of said recesses.

12. The storage unit according to claim 11, wherein the moving means comprise:
    a lifting unit suited to lift said trays and arranged in a compartment obtained in said containment structure and suited to be accessed by an operator from the external environment;
    at least one Cartesian robot arranged inside said containment structure and comprising moving and gripping means configured so that they can collect/deposit each one of said trays from/on said lifting unit through said opening and deposit/collect it in/from said accumulation structure;
    measuring means suited to measure the height of each one of said trays with said one or more spacers, if any, and of each object contained in it;
    programmable electronic means suited to manage the movements of said Cartesian robot.

13. The storage unit according to claim 1, wherein the measurements of the height of each one of said spacer elements, of the thickness of each one of said projections and of the pitch of said recesses are correlated with one another according to the relation: H+S≤P.

14. The storage unit according to claim 13, wherein each one of said vertical walls comprises one or more vertical elements aligned vertically on top of one another, the measurement of the length of each one of said vertical elements being an integral multiple of said pitch of said recesses.

15. The storage unit according to claim 13, wherein the moving means comprise:
    a lifting unit suited to lift said trays and arranged in a compartment obtained in said containment structure and suited to be accessed by an operator from the external environment;
    at least one Cartesian robot arranged inside said containment structure and comprising moving and gripping means configured so that they can collect/deposit each one of said trays from/on said lifting unit through said opening and deposit/collect it in/from said accumulation structure;
    measuring means suited to measure the height of each one of said trays with said one or more spacers, if any, and of each object contained in it;
    programmable electronic means suited to manage the movements of said Cartesian robot.

16. The storage unit according to claim 2, wherein the moving means comprise:
    a lifting unit suited to lift said trays and arranged in a compartment obtained in said containment structure and suited to be accessed by an operator from the external environment;
    at least one Cartesian robot arranged inside said containment structure and comprising moving and gripping means configured so that they can collect/deposit each one of said trays from/on said lifting unit through said opening and deposit/collect it in/from said accumulation structure;
    measuring means suited to measure the height of each one of said trays with said one or more spacers, if any, and of each object contained in it;
    programmable electronic means suited to manage the movements of said Cartesian robot.

* * * * *